United States Patent [19]
Lebby et al.

[11] Patent Number: 5,956,363
[45] Date of Patent: Sep. 21, 1999

[54] LONG WAVELENGTH VERTICAL CAVITY SURFACE EMITTING LASER WITH OXIDATION LAYERS AND METHOD OF FABRICATION

[75] Inventors: Michael S. Lebby, Apache Junction; Jamal Ramdani, Gilbert; Wenbin Jiang, Phoenix, all of Ariz.

[73] Assignee: Motorola, Inc., Schaumburg, Ill.

[21] Appl. No.: 08/912,940

[22] Filed: Aug. 15, 1997

[51] Int. Cl.$^6$ ....................................................... H01S 3/19
[52] U.S. Cl. .................................................. 372/46; 372/96
[58] Field of Search .................................. 372/96, 45, 46

[56] References Cited

U.S. PATENT DOCUMENTS 5,764,671  6/1998  Lebby et al. ............................... 372/45
5,809,051  9/1998  Oudar ......................................... 372/45

*Primary Examiner*—James W. Davie
*Attorney, Agent, or Firm*—Eugene A. Parsons; William E. Koch

[57] ABSTRACT

A VCSEL for emitting long wavelength light and method of fabrication including a substrate element, a first stack of distributed Bragg reflectors, a first oxide layer, a GaInAsN active region with an active structure sandwiched between a first cladding region adjacent the first oxide layer and a second cladding region, the active structure including a nitride based quantum well, a second oxide layer adjacent the active region, and a second stack of distributed Bragg reflectors adjacent the second oxide layer.

15 Claims, 2 Drawing Sheets

LONG WAVELENGTH VERTICAL CAVITY SURFACE EMITTING LASER WITH OXIDATION LAYERS AND METHOD OF FABRICATION

FIELD OF THE INVENTION

This invention relates to vertical cavity surface emitting lasers and more specifically to vertical cavity surface emitting lasers for emitting long wavelength light.

BACKGROUND OF THE INVENTION

Vertical cavity surface emitting lasers (VCSEL) include a first distributed Bragg reflector (DBR), also referred to as a mirror stack, formed on top of a substrate by semiconductor manufacturing techniques, an active region formed on top of the first mirror stack, and a second mirror stack formed on top of the active region. The VCSEL is driven by a current forced through the active region, typically achieved by providing a first contact on the reverse side of the substrate and a second contact on top of the second mirror stack.

The use of mirror stacks in VCSELs is well established in the art. Typically, mirror stacks are formed of multiple pairs of layers often referred to as mirror pairs. The pairs of layers are formed of a material system generally consisting of two materials having different indices of refraction and being easily lattice matched to the other portions of the VCSEL. For example, a GaAs based VCSEL typically uses an AlAs/GaAs or AlGaAs/AlAs material system wherein the different refractive index of each layer of a pair is achieved by altering the aluminum content in the layers. In conventional devices, the number of mirror pairs per stack may range from 20–40 to achieve a high percentage of reflectivity, depending on the difference between the refractive indices of the layers. The large number of pairs increases the percentage of reflected light.

In conventional VCSELs, conventional material systems perform adequately. However, new products are being developed requiring VCSELs which emit light having longer wavelengths. Accordingly, VCSELs emitting light having a long wavelength are of great interest in the optical telecommunication industry. As an example, a long wavelength VCSEL can be obtained by using a VCSEL having an InGaAs/InGaAsP active region. When an InGaAs/InGaAsP active region is used, an InP/InGaAsP material system must be used for the mirror stacks in order to achieve a lattice match to the InP. In this system, however, it is practically impossible to achieve decent DBR based mirrors because of the insignificant difference in the refractive indices in this material system. Many attempts have been made to address this problem including a wafer bonding technique in which a DBR mirror is grown on a separate substrate and bonded to the active region. This technique has had some limited success and also the interface defect density in the wafer fusion procedure causes potential reliability problems.

It would be highly advantageous, therefore, to remedy the foregoing and other deficiencies inherent in the prior art.

Accordingly, it is an object of the present invention to provide a new and improved long wavelength VCSEL.

Another object of the invention is to provide a reliable long wavelength VCSEL.

Still another object of the immediate invention is to provide for an improvement in the efficiency, optical mode control, and current confinement in a long wavelength VCSEL.

Another object of the present invention is to provide for a decrease in threshold current in a long wavelength VCSEL.

Yet another object of the invention is to provide for a method of fabricating a long wavelength VCSEL that includes a more efficient design.

SUMMARY OF THE INVENTION

Briefly, to achieve the desired objects of the instant invention in accordance with a preferred embodiment thereof, provided is a VCSEL for emitting long wavelength light. The VCSEL includes a substrate element, a first mirror stack disposed on the substrate, element, an oxide layer formed on the first mirror stack, a GaInAsN active region including a nitride based quantum well, the active region being disposed on the first mirror stack, a second oxide layer formed on the active region, and a second mirror stack disposed on the second oxide layer. The first and second oxide layers having an aperture formed therein.

In a preferred embodiment the active region and the first and the second mirror stacks are configured to emit light with a wavelength in a range of approximately 1.3–1.6 micrometers. The quantum well is configured with a direct energy band-gap in a range of approximately 0.775–0.954 eV.

Also provided is a method of fabricating a VCSEL for emitting long wavelength light. The method includes providing a substrate having a surface, epitaxially growing a first mirror stack on the surface, epitaxially growing a first oxide layer on the first mirror stack, epitaxially growing a GaInAsN active region including a nitride based quantum well on the first oxide layer, epitaxially growing a second oxide layer on the active region, epitaxially growing a second mirror stack on the second oxide layer, selectively etching the plurality of layers to form a ridge-like structure having a plurality of exposed edges and exposing the structure to an oxidizing environment, thereby oxidizing the first and second oxide layers.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE PREFERRED EMBODIMENT

Figure 1:
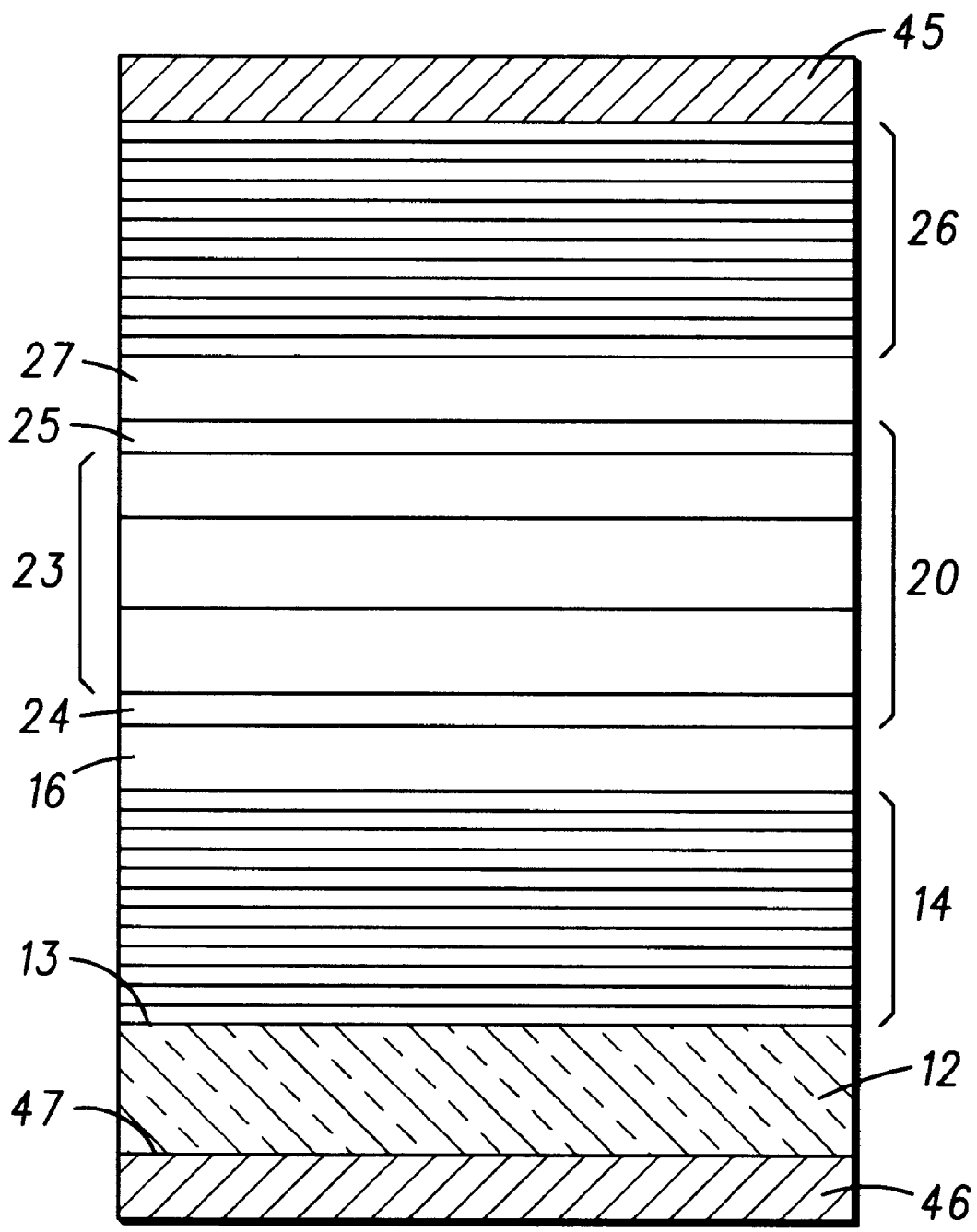
FIG. 1 is a sectional view of the epitaxial deposition of a plurality of layers forming a VCSEL in accordance with the present invention.

Turning now to the drawings in which like reference characters indicate corresponding elements throughout the several views, attention is first directed to FIG. 1 which illustrates a long wavelength vertical cavity surface emitting laser (VCSEL) generally designated 10. Typically, VCSELs are formed by depositing a plurality of layers on a substrate to form the VCSEL. See, for example, U.S. Pat. No. 5,034,092, entitled "PLASMA ETCHING OF SEMICONDUCTOR SUBSTRATES", issued Jul. 23, 1991, assigned to the same assignee and included herein by this reference, and U.S. Pat. No. 5, 256, 596, entitled "TOP EMITTING VCSEL WITH IMPLANT", issued Oct. 26, 1993, assigned to the same assignee and included herein by this reference.

VCSEL 10 of the present invention is formed on a substrate 12, which in this specific embodiment, is GaAs, more specifically either GaAs (100) or GaAs (111). GaAs is used to facilitate epitaxial growth of the components of VCSEL 10 which emits light in long wavelengths approximately in the range of 1.3 $\mu$m–1.6 $\mu$m. While it should be understood that either GaAs (100) or GaAs (111) can be used for substrate 12, when GaAs (111) is employed, the surface crystal orientation will allow for longer wavelength continuous wave (CW) operation at normal operating temperatures. More specifically, the use of a GaAs material having a (111) oriented substrate will allow for the extension of an emitted wavelength up to 1.1 $\mu$m when InGaAsN is used in the active region. This wavelength extension is extremely hard to achieve on a (100) substrate surface crystal orientation.

Substrate 12 has an upper surface 13 on which a first stack of distributed Bragg reflectors, or mirror stack, 14 is disposed. First stack 14 of distributed Bragg reflectors includes a plurality of mirror pairs in a GaAs/AlGaAs material system. In the alternative, stack 14 can include a plurality of mirror pairs in a InGaP/GaAs material system. A first selective oxide layer 16 is disposed on first stack 14 of distributed Bragg reflectors and includes an AlAs material system. An active region 20 is disposed on first oxide layer 16. Active region 20, as further detailed herein, includes an active structure 23 sandwiched between a first cladding region 24 adjacent first oxide layer 16 and a second cladding region 25. A second selective oxide layer 27 is disposed on a surface of second cladding region 25. A second stack 26 of distributed Bragg reflectors is disposed on second oxidized layer 27 and includes mirror pairs in a GaAs/AlGaAs material system or alternatively, an InGaP/GaAs material system.

First stack 14 of distributed Bragg reflectors is grown by epitaxially depositing pairs of layers on substrate 12. In order to crystal lattice match stack 14 to substrate 12 a suitable semiconductor material system must be deposited. In this specific example, substrate 12 is GaAs (111) and, therefore, a GaAs/AlGaAs material system is employed. Approximately 20–40 mirror pairs of this material system are deposited on substrate 12 depending on the difference between the refractive indices of the layers. The different refractive index of the layers of each pair is achieved by altering the aluminum content. In this specific embodiment, a GaAl$_{.7}$As layer and a GaAs layer forming a mirror pair is preferred. The large number of pairs increases the percentage of reflected light.

Figure 2:
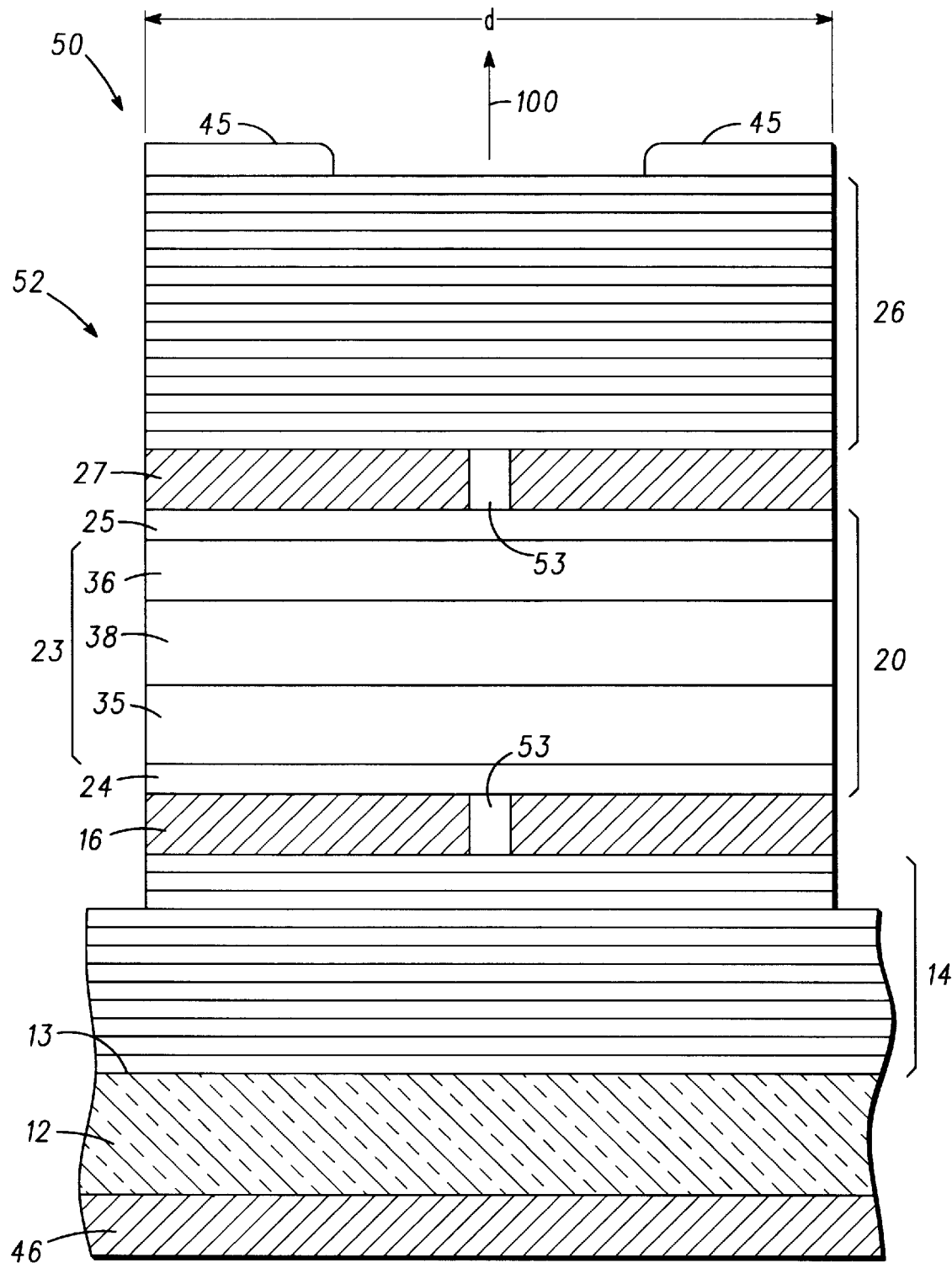
FIG. 2 is a sectional view of the VCSEL of FIG. 1 in accordance with the present invention having undergone selective etching and oxidation to form a complete VCSEL structure.

First selective oxide layer 16 and second selective oxide layer 27 can be made as single layer, as generally illustrated in FIGS. 1 and 2, or as a plurality of layers. Oxide layers 16 and 27 include any suitable material or combination of material that can be oxidized such that the material is oxidized upon exposure to an oxidation environment. In this particular embodiment first oxide layer 16 and second oxide layer 27 include a plurality of thin layers of AlAs. In a preferred embodiment first oxide layer 16 and second oxide layer 27 are formed at the optical mode nexus, preferably at the node of the optical resonant wave, on both sides of active region 20. In the alternative, the oxide layers 16 and 27 can be formed on either side of the active region 20 within the adjacent mirror structure 14 and 26, respectively. Each oxide layer 16 and 27 is on the order of 10–400 Å in thickness, but due to the strain in crystal lattices that use different material lattice constants, in a preferred embodiment the preferred thickness is 50–150 Å in thickness. This thickness will allow for oxidation from the side of the structure in a mesa etch configuration (discussed presently). In addition, the composition of the AlAs can change slightly to allow for different oxidation rates. For example, oxide layers 16 and 27 can include a few percentage points of gallium (Ga) or indium (In) in addition to having a slight nitride (N) or phosphide (P) compound. Examples of material systems that can be utilized for oxide layers 16 and 27 of the present invention, include for example, AlAsN, AlAsP, AlGaAs, AlInAs, AlAs (InN), and AlAs(InP) where the aluminum is typically greater than 90% of the mole fraction. The inclusion of oxide layers 16 and 27 provides for an improvement in the efficiency of VCSEL 10, more particularly, increased optical mode control, better current confinement, decreased threshold current, and higher modulation speed.

Referring again to FIGS. 1 and 2, cladding region 24 includes one or more layers which may be graded if necessary for more efficient carrier confinement in active structure 23. In this specific embodiment, cladding region 24 is formed of a GaAs material system. In the alternative, cladding region 24 can be formed of a InGaP or AlGaAs material system.

Active structure 23, in this embodiment, includes two nitride (N) based quantum well layers 35 and 36 separated by barrier layer 38. For example quantum well layers 35 and 36 and barrier layer 38 are each approximately 100 Å thick and the total thickness of active region 20 is approximately one wavelength of the emitted light or a multiple thereof. Quantum well layers 35 and 36 are formed of $Ga_{1-y}In_yAs_{1-x}(N)_x$, more particularly, quantum well layers 35 and 36 are formed of $Ga_{0.75}In_{0.25}As_{1-x}(N)_x$ where x=0.0001 to 0.1. One skilled in the art will understand that more or fewer quantum well layers and barrier layers can be used depending upon the application. Active region 20 and first and second stacks 14 and 26 of distributed Bragg reflectors, respectively, are configured to emit light with a wavelength in a range of approximately 1.3–1.6 micrometers. To achieve this range the quantum wells are configured with a direct energy band-gap in a range of approximately 1.42 eV with y=0 to 0.7 eV with y=0.3. The mole fraction of indium (0–30%), in this particular embodiment, is higher than that required when the VCSEL structure is grown on a (100) orientation substrate element. In that the incorporation of a nitride based quantum well active region is difficult at low growth temperatures, the use of the GaAs (111) substrate further facilitates the achievement of long wavelength operation by adding a small fraction of nitrogen to the InGaAs. This fraction is much lower than the one required for the GaAs (100).

Cladding region 25 includes one or more layers which may be graded if necessary for more efficient carrier confinement in active structure 23. In this specific embodiment, cladding region 25 is formed of a GaAs/AlGaAs material system. In the alternative, cladding region 25 can be formed of a GaAs/InGaP or GaAsP material system.

Second stack 26 of distributed Bragg reflectors is grown by epitaxially depositing pairs of layers on second oxide layer 27 (discussed previously). In order to crystal lattice match stack 26 to active structure 23, a suitable semiconductor material system must be deposited. In this specific example, cladding region 25 is GaAs based and, therefore, a GaAs/AlGaAs material system is employed. Approximately 20–40 mirror pairs of this material system are deposited on second oxide layer 27 depending on the difference between the refractive indices of the layers. The different refractive index the layers of each pair is achieved by altering the aluminum content. In this specific embodiment, a GaAl$_{.7}$As$_{.3}$ layer and a GaAs layer forming a mirror pair is preferred. The large number of pairs increases the percentage of reflected light.

Doping of stack 14 and 26 of distributed Bragg reflectors is achieved by using any suitable n-type dopant and p-type dopant, respectively. However, it should be understood that while on of stacks 14 and 26 of distributed Bragg reflectors will be selected as being p-type doped, the other stack 26 and 14 will be n-type doped. Generally, any suitable n-type dopant, such as selenium, (Se), silicon (Si), cesium, (Cs), or the like, or any suitable p-type dopant, such as carbon (C), beryllium (Be), or the like can be used. Concentrations of these dopants range from 1E15 $cm^{-3}$ to 1E20 $cm^{-3}$, with preferred range from 1E16 $cm^{-3}$ to 1E20 $cm^{-3}$, with a nominal range from 1E17 $cm^{-3}$ to 1E19 $cm^{-3}$, and a nominal value of 1E18 $cm^{-3}$.

To complete VCSEL 10, a p-contact layon mirror stacioned on mirror stack 26, and a n-contact layer 46 is positioned on substrate 12, for example on the rear surface thereof, when mirror stack 26 is p-type dope and mirror stack 14 is n-type doped. As will be understood by those skilled in the art contact 45 is so constructed as to permit the emission of light from VCSEL 10. Contact layers 45 and 46 provide an electrical contact for VCSEL 10. By providing contact layer 46 on substrate 12, substrate 12 becomes a part of an electrical path to mirror stack 14. Additionally, it should be understood that contact layer 45 is electrically coupled to contact layer 46 through stack 14 and 26 of distributed Bragg reflectors, oxide layers 16 and 27, cladding regions 24 and 25 and active structure 23 to inject carriers into VCSEL 10, thereby making a complete electrical circuit which allows light 100 to be generated and subsequently emitted from VCSEL 10.

Generally, contact layer 46 is formed to provide an electrical path from contact layer 46 to stack 14 of distributed Bragg reflectors. Formation of contact layer 46 typically is one of the last remaining steps in the formation of VCSEL 10; however, it is described here so as to more clearly describe the present invention. Contact layer 46 is made by any well-known method or combination of methods in the art, such as deposition (e.g., evaporation, sputtering or the like), heating (e.g., annealing), polishing (e.g., chemical mechanical polishing), or the like. Briefly and by way of example only, a conductive metal is deposited onto surface 47 of substrate 12. After the deposition, a heating step or an anneal step is performed to substrate 12, thereby annealing the conductive metal to substrate 12 and electrically coupling stack 14 of distributed Bragg reflectors to contact layer 46 through substrate 12.

However, it should be noted that other alternatives or methods are also available for electrically coupling stack 14 of distributed Bragg reflectors to an electrical source. By way of another example, stack 14 of distributed Bragg reflectors can be directly coupled by exposing a portion of stack 14 of distributed Bragg reflectors by any suitable method, such as but not limited to, etching, photolithography, or the like. The exposed area is then metalized to form an electrical contact. Thus, the electrical contact provides an area for electrical bonding to electrically couple VCSEL 10.

Once the material layers have been fabricated on substrate 12, the material layers are patterned by any suitable method or combination of methods, such as photolithography, etching, deposition, or the like, thereby forming a ridge 50, or mesa-like structure. By forming ridge 50, edges 52 of cladding regions 24 and 25, oxide layers 16 and 27, active region 20, second stack 26 of distributed Bragg reflectors, and contact layer 45 are either exposed or partially exposed.

Having exposed edges, 52, first oxide layer 16 and second oxide layer 27 are oxidized by any suitable method, such as exposure to oxygen (O), exposure to heated oxygen (O), exposure to steam ($H_2O$), or the like. Typically, these methods are carried out in a reaction chamber that is capable of controlling several process parameters, such as temperature, pressure, gas input, and the like. Generally, control of the oxidation process is achieved by varying process parameters, such as oxygen (O), steam ($H_2O$), temperature, pressure, and the like.

Generally, the temperature for the oxidation process ranges from 250 to 550 degrees Celsius, with a nominal range from 300 to 500 degrees Celsius, and a nominal value of 400 degrees Celsius. Pressure can range from one atmosphere to ten atmospheres. Oxide layers 16 and 27 undergo a controlled oxidation so as to form an aperture 53 in the center of each oxide layer 16 and 27. More particularly, by controlling the duration and pressure at which oxide layers 16 and 27 are oxidized from edges 52 toward the center of the structure, aperture 53 is formed. Aperture 53 ranges from approximately 1–50 microns in diameter, with a preferred diameter of 5–20 microns. Ridge structure 50 has a diameter "d" fabricated approximately 10–20 microns wider than the diameter of aperture 53. By forming oxide layers 16 and 27, several advantages are realized including but not limited to, improved carrier confinement, decreased series resistance, more controllable VCSEL transverse mode, and the like which improves optical gain, lowers the threshold current of VCSEL 10, and ensures better overlap between optical mode and gain profile/carrier distribution.

Various changes and modifications to the embodiments herein chosen for purposes of illustration will readily occur to those skilled in the art. For example, it should be understood that VCSEL structure symmetry exists for both the p and n dopants as well as electrically inverted structure designs. To the extent that such modifications and variations do not depart from the spirit of the invention, they are intended to be included within the scope thereof which is assessed only by a fair interpretation of the following claims.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A vertical cavity surface emitting laser for emitting long wavelength light, the vertical cavity surface emitting laser comprising:

a substrate having a surface;

a first stack of distributed Bragg reflectors disposed on the surface of the substrate;

a first oxide layer disposed on the first stack of distributed Bragg reflectors, and including an aperture formed therein;

a GaInAsN active region including a nitride based quantum well, the active region being disposed on the first oxide layer;

a second oxide layer disposed on the active region, and including an aperture formed therein; and a second stack of distributed Bragg reflectors disposed on the second oxide layer.

2. A vertical cavity surface emitting laser as claimed in claim 1 wherein the active region and the first and the second stacks of distributed Bragg reflectors are configured to emit light with a wavelength in a range of approximately 1.3–1.6 micrometers.

3. A vertical cavity surface emitting laser as claimed in claim 1 wherein the nitride based quantum well is configured with a direct energy band-gap in a range of approximately 0.775–0.954 eV.

4. A vertical cavity surface emitting laser as claimed in claim 1 wherein the nitride based quantum well includes $Ga_{1-y}In_yAs_{1-x}(N)_x$.

5. A vertical cavity surface emitting laser as claimed in claim 1 wherein the nitride based quantum well includes $Ga_{0.75}In_{0.25}N_xAs_{x-1}$.

6. A vertical cavity surface emitting laser as claimed in claim 5 wherein x has a range of 0.00–0.1.

7. A vertical cavity surface emitting laser as claimed in claim 1 wherein the first oxide layer and the second oxide layer are formed of aluminum arsenide.

8. A vertical cavity surface emitting laser as claimed in claim 1 wherein the first oxide layer and the second oxide layer are formed of an aluminum arsenide material having a percentage of one of gallium (Ga) and indium (In) as a part thereof, in addition to one of nitride (N) and phosphide (P).

9. A vertical cavity surface emitting laser as claimed in claim 8 wherein the aluminum has a mole fraction of greater than 90 percent.

10. A vertical cavity surface emitting laser for emitting long wavelength light, the vertical cavity surface emitting laser comprising:

a substrate having a surface;

a first mirror stack disposed on the substrate;

a first oxide layer disposed on the first mirror stack, and including an aperture formed therein;

a GaInAsN active region including an active structure sandwiched between a first cladding region adjacent the first oxide layer and a second cladding region, the active structure including a nitride based quantum well;

a second oxide layer disposed on the active region, and including an aperture formed therein; and a second mirror stack disposed on the second oxide layer.

11. A vertical cavity surface emitting laser as claimed in claim 10 wherein the active structure includes a first barrier layer, a second barrier layer, and a quantum well with the quantum well being positioned therebetween.

12. A vertical cavity surface emitting laser as claimed in claim 11 wherein the active region and the first and the second mirror stacks are configured to emit light with a wavelength in a range of approximately 1.3–1.6 micrometers.

13. A vertical cavity surface emitting laser as claimed in claim 10 wherein the first oxide layer and the second oxide layer are formed of aluminum arsenide.

14. A vertical cavity surface emitting laser as claimed in claim 10 wherein the first oxide layer and the second oxide layer are formed of an aluminum arsenide material having a percentage of one of gallium (Ga) and indium (In) as a part thereof, in addition to one of nitride (N) and phosphide (P).

15. A vertical cavity surface emitting laser as claimed in claim 14 wherein the aluminum has a mole fraction of greater than 90 percent.

* * * * *